(12) United States Patent
Kim

(10) Patent No.: US 7,297,609 B2
(45) Date of Patent: Nov. 20, 2007

(54) METHOD FOR FABRICATING SEMICONDUCTOR DEVICE

(75) Inventor: Jae Hee Kim, Gyeonggi-do (KR)

(73) Assignee: Donogbu Electronics Co., Ltd., Seoul (KR)

( * ) Notice: Subject to any disclaimer, the term of this patent is extended or adjusted under 35 U.S.C. 154(b) by 131 days.

(21) Appl. No.: 11/320,464

(22) Filed: Dec. 29, 2005

(65) Prior Publication Data

US 2006/0148199 A1    Jul. 6, 2006

(30) Foreign Application Priority Data

Dec. 30, 2004    (KR) .................. 10-2004-0117029

(51) Int. Cl.
*H01L 21/76* (2006.01)
(52) U.S. Cl. .................. 438/427; 438/435; 438/437; 257/E21.546
(58) Field of Classification Search .................. 438/424, 438/435, 437; 257/E21.54, E21.546
See application file for complete search history.

(56) References Cited

U.S. PATENT DOCUMENTS 5,599,722 A * 2/1997 Sugisaka et al. ............ 438/406

2004/0063263 A1* 4/2004 Suzuki et al. ............... 438/197
2005/0121705 A1* 6/2005 Kawasaki et al. ........... 257/288

* cited by examiner

*Primary Examiner*—Trung Dang
(74) *Attorney, Agent, or Firm*—McKenna Long & Aldridge LLP

(57) ABSTRACT

A method for fabricating a semiconductor device includes the steps of sequentially forming a pad oxide layer and a pad nitride layer on a substrate, the pad oxide layer including a first oxide layer formed on an upper surface of the substrate and a second oxide layer formed on a lower surface of the substrate, and the pad nitride layer including a first nitride layer formed on the upper surface of the substrate and a second nitride layer formed on the lower surface of the substrate; patterning the first nitride layer by removing a portion of the first nitride layer; forming a trench in the substrate corresponding to the removed portion of the first nitride layer, thereby patterning the first oxide layer; filling the trench with an insulating material to form a device isolation layer; forming a passivation layer on the substrate, the passivation layer including a first passivation layer formed on the upper surface of the substrate including the device isolation layer, and a second passivation layer formed on the lower surface of the substrate including the second oxide layer and the second nitride layer; and removing the first passivation layer, the patterned first oxide layer, and patterned first nitride layer.

13 Claims, 11 Drawing Sheets

METHOD FOR FABRICATING SEMICONDUCTOR DEVICE

CROSS-REFERENCE TO RELATED APPLICATIONS

This application claims the benefit of Korean Patent Application No. 10-2004-0117029, filed on Dec. 30, 2004, which is hereby incorporated by reference as if fully set forth herein.

BACKGROUND OF THE INVENTION

1. Field of the Invention

The present invention relates to a semiconductor device, and more particularly, to a method for fabricating a semiconductor device, in which a silicon nitride layer is formed on a lower surface of a semiconductor substrate to prevent the lower surface of the semiconductor substrate from being contaminated by copper during a copper line formation process.

2. Discussion of the Related Art

Device isolation of a semiconductor device may be achieved by local oxidation of silicon or by shallow-trench isolation. FIGS. 1A-1E illustrate a conventional method for fabricating a semiconductor device using shallow-trench isolation.

As shown in FIG. 1A, a semiconductor substrate 100 having an active area and a non-active area is prepared. A pad oxide layer 101 and a pad nitride layer 107 are sequentially deposited on the entire surface of the semiconductor substrate 100.

As shown in FIG. 1B, a photoresist is coated on the entire surface of the semiconductor substrate 100, including the pad oxide layer 101 and the pad nitride layer 107, and is then patterned by photolithography, thereby forming a photoresist pattern PR on the pad nitride layer 107. The photoresist is patterned to cover the active area of the semiconductor substrate 100. Subsequently, the exposed portion of the pad oxide layer 101 is etched and removed with the patterned photoresist PR used as a mask.

As shown in FIG. 1C, after removing the photoresist pattern PR, the exposed pad oxide layer 101 and the semiconductor substrate 100 are removed with the patterned pad nitride layer 107 used as a mask. Thus, a trench 102 is formed in the non-active area of the semiconductor substrate 100.

As shown in FIG. 1D, an insulating layer is deposited on the entire surface of the semiconductor substrate 100, including the trench 102. The deposited insulating layer is then planarized by chemical-mechanical polishing until the pad nitride layer 107 is exposed. Thus, the insulating layer is selectively formed inside the trench 102. In this case, the insulating layer of the trench 102 serves as a device isolation layer 103.

As shown in FIG. 1E, the device isolation layer 103 is exposed by removing the patterned pad oxide layer 101 and the pad nitride layer 107.

However, the semiconductor substrate may become contaminated if copper permeates an exposed lower surface of the semiconductor substrate during a subsequent copper line formation process.

SUMMARY OF THE INVENTION

Accordingly, the present invention is directed to a method for fabricating a semiconductor device that substantially obviates one or more problems due to limitations and disadvantages of the related art.

The present invention provides a method for fabricating a semiconductor device in which a silicon nitride layer is formed on a lower surface of a semiconductor substrate to prevent the lower surface of the semiconductor substrate from being contaminated by copper during a copper line formation process.

Additional advantages, objects, and features of the invention will be set forth in part in the description which follows and will become apparent to those having ordinary skill in the art upon examination of the following. The objectives and other advantages of the invention may be realized and attained by the structure particularly pointed out in the written description and claims hereof as well as the appended drawings.

To achieve these and other advantages in accordance with the invention, as embodied and broadly described herein, a method for fabricating a semiconductor device comprises sequentially forming a pad oxide layer and a pad nitride layer on a substrate, the pad oxide layer including a first oxide layer formed on an upper surface of the substrate and a second oxide layer formed on a lower surface of the substrate, and the pad nitride layer including a first nitride layer formed on the upper surface of the substrate and a second nitride layer formed on the lower surface of the substrate; patterning the first nitride layer by removing a portion of the first nitride layer; forming a trench in the substrate corresponding to the removed portion of the first nitride layer, thereby patterning the first oxide layer; filling the trench with an insulating material to form a device isolation layer; forming a passivation layer on the substrate, the passivation layer including a first passivation layer formed on the upper surface of the substrate including the device isolation layer, and a second passivation layer formed on the lower surface of the substrate including the second oxide layer and the second nitride layer; and removing the first passivation layer, the patterned first oxide layer, and patterned first nitride layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate exemplary embodiments of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

FIGS. 2A-2H illustrate a semiconductor device fabricated in accordance with an first exemplary embodiment of the present invention.

Figure 1A:
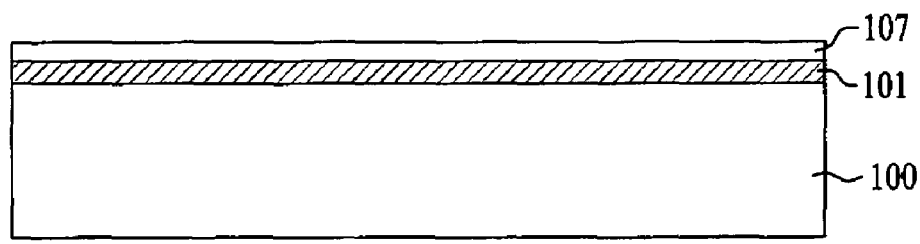
FIGS. 1A-1E are cross-sectional views of a semiconductor device fabricated in accordance with a conventional method.
Figure 1B:
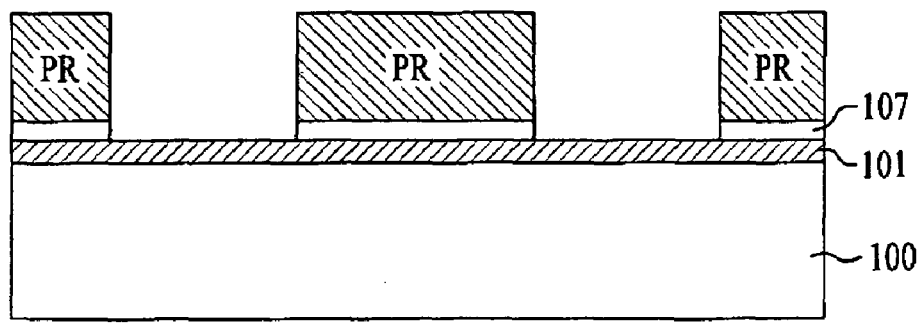
Figure 1C:
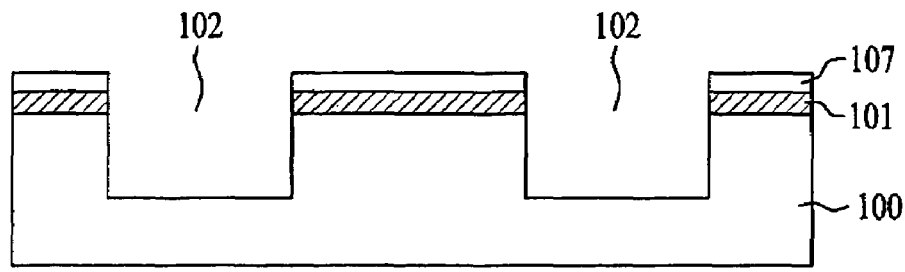
Figure 1D:
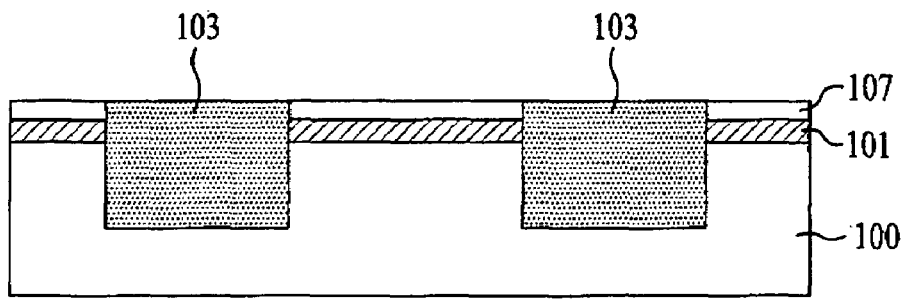
Figure 1E:
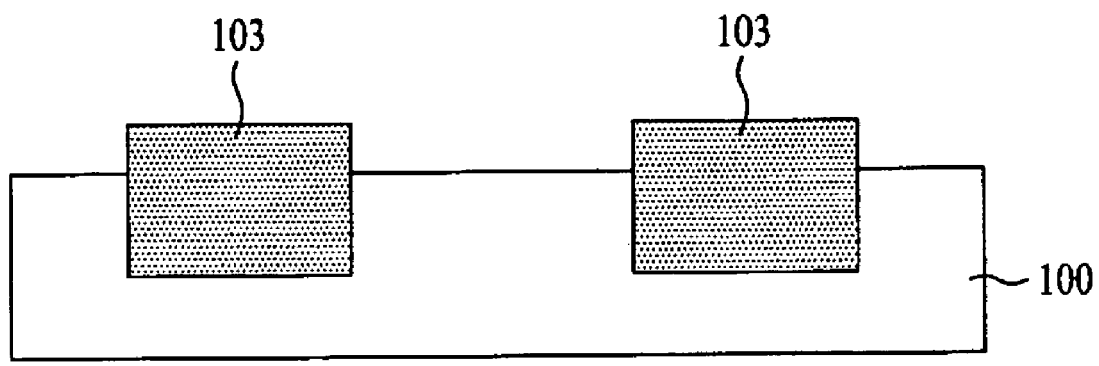
Figure 2A:
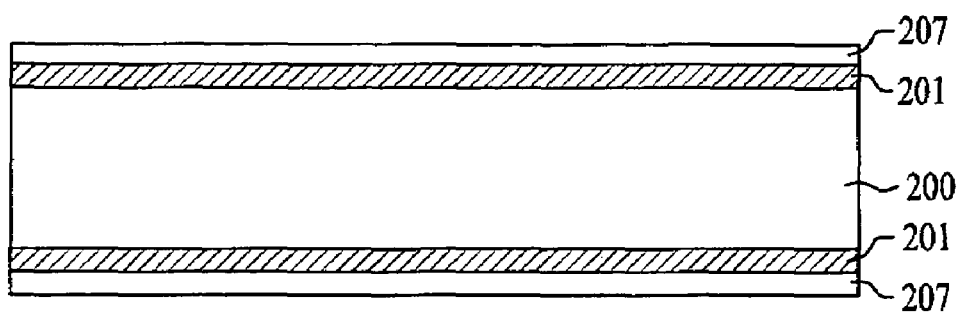
FIGS. 2A-2H are cross-sectional views of a semiconductor device fabricated in accordance with an first exemplary embodiment of the present invention.

As shown in FIG. 2A, a semiconductor substrate 200, including an active area and a non-active area, is prepared. A pad oxide layer 201 and a pad nitride layer 207 are sequentially deposited on the entire upper surface of the semiconductor substrate 200. The pad nitride layer 207 can be formed of silicon nitride. The remaining portions of a semiconductor device will be formed on the upper surface of the semiconductor substrate 200.

Figure 2B:
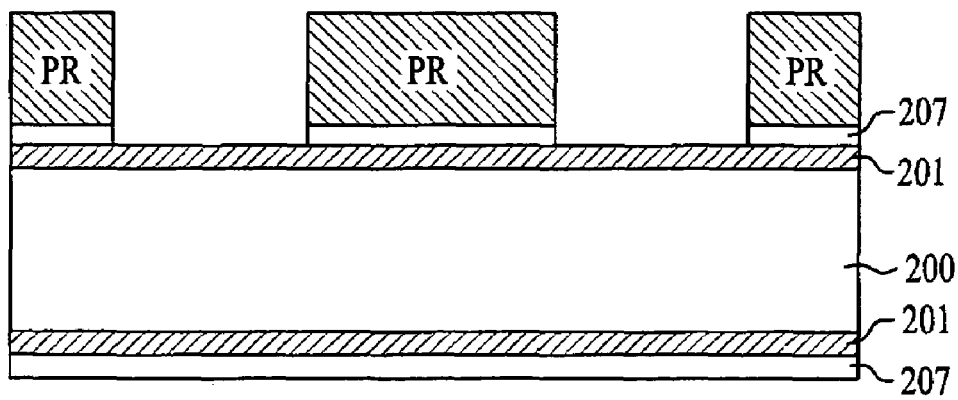

As shown in FIG. 2B, a photoresist is coated on the entire upper surface of the semiconductor substrate 200, including the pad oxide layer 201 and the pad nitride layer 207, and the coated photoresist is then patterned by photolithography. Thus, a photoresist pattern PR is formed on the pad nitride layer 207 provided on the upper surface of the semiconductor substrate 200. At this time, the photoresist is patterned to cover the active area of the semiconductor substrate 200. With the photoresist pattern PR used as a mask, the exposed pad oxide layer 201 is etched and removed.

Figure 2C:
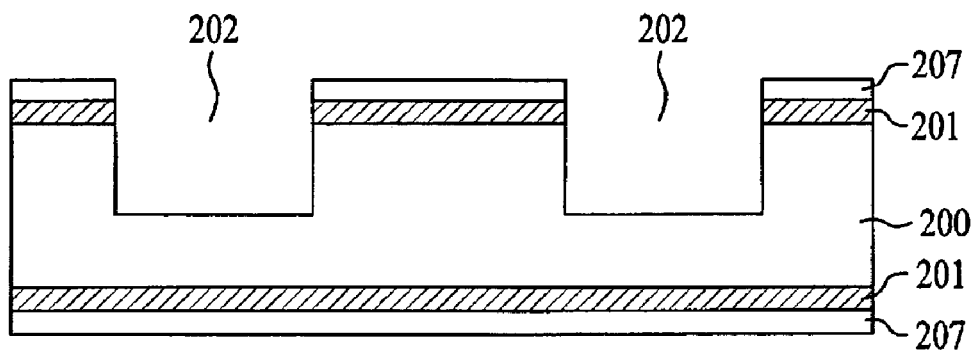

As shown in FIG. 2C, after removing the photoresist pattern PR, the exposed pad oxide layer 201 and the upper surface of the semiconductor substrate 200 are removed with the patterned nitride layer 207 used as a mask, thereby forming a trench 202 in the non-active area of the semiconductor substrate 200.

Although not shown, when performing an etching process with the photoresist pattern PR used as a mask, the pad oxide layer 201, the pad nitride layer 207 and the upper surface of the semiconductor substrate 200 may be etched in sequence to form the trench 202 in the non-active area of the semiconductor substrate 200.

Figure 2D:
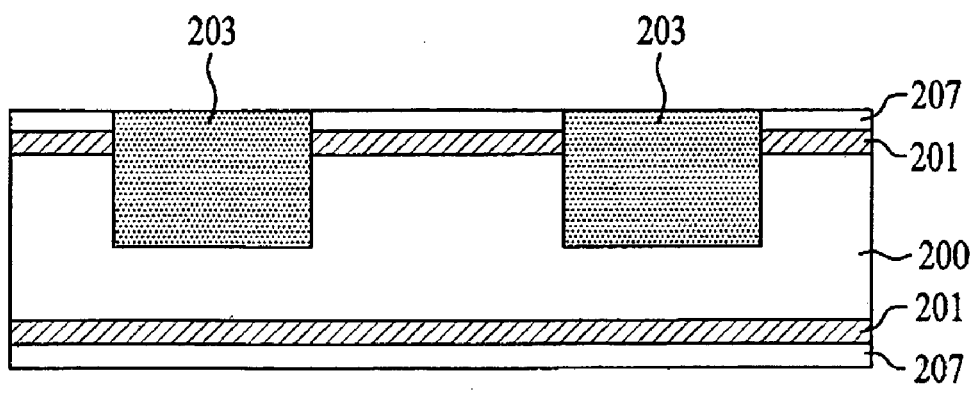

As shown in FIG. 2D, an insulating layer is deposited on the entire upper surface of the semiconductor substrate 200, including the trench 202, and then chemical-mechanical polishing is performed to the deposited insulating layer. The deposited insulating layer is planarized until the pad nitride layer 207 is exposed. As a result, the insulating layer is selectively formed inside the trench 202. The insulating layer formed inside the trench 202 functions as a device isolation layer 203.

Figure 2E:
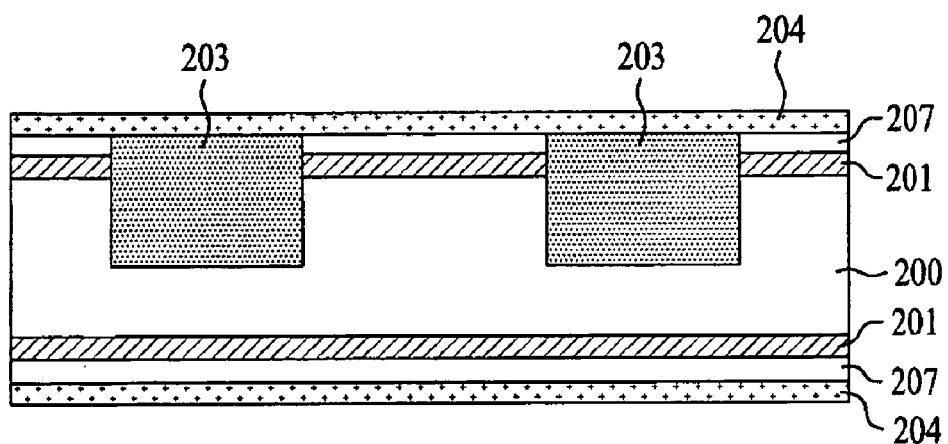

As shown in FIG. 2E, a passivation layer 204 is formed on each of the entire lower and upper surfaces of the semiconductor substrate 200. Thus, the passivation layer 204 formed on the entire upper surface of the semiconductor substrate 200 covers the device isolation layer 203, the patterned pad oxide layer 201 and the pad nitride layer 207. The passivation layer 204 formed on the entire lower surface of the semiconductor substrate 200 covers the pad oxide layer 201, and the pad nitride layer 207. At this time, the passivation layer 204 prevents the pad nitride layer 207 formed on the lower surface of the semiconductor substrate 200 from being etched. The passivation layer 204 can be formed of tetra-ethyl-ortho-silicate.

Figure 2F:
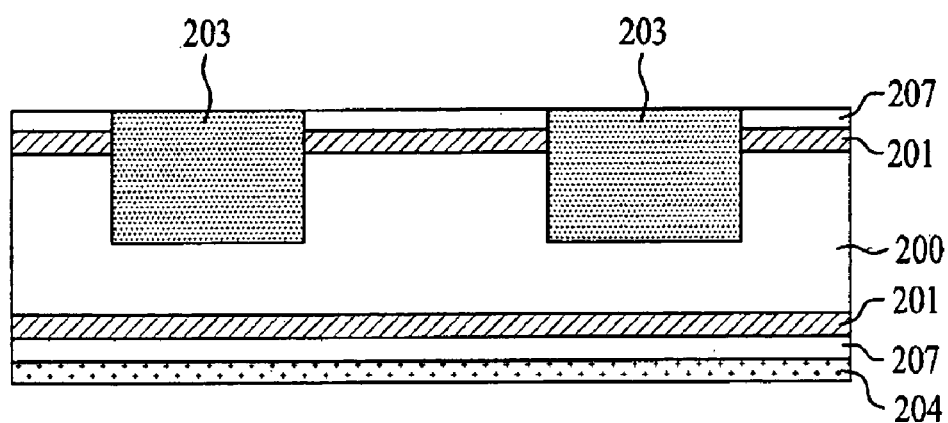

As shown in FIG. 2F, the passivation layer 204 formed on the upper surface of the semiconductor substrate 200 is removed.

Figure 2G:
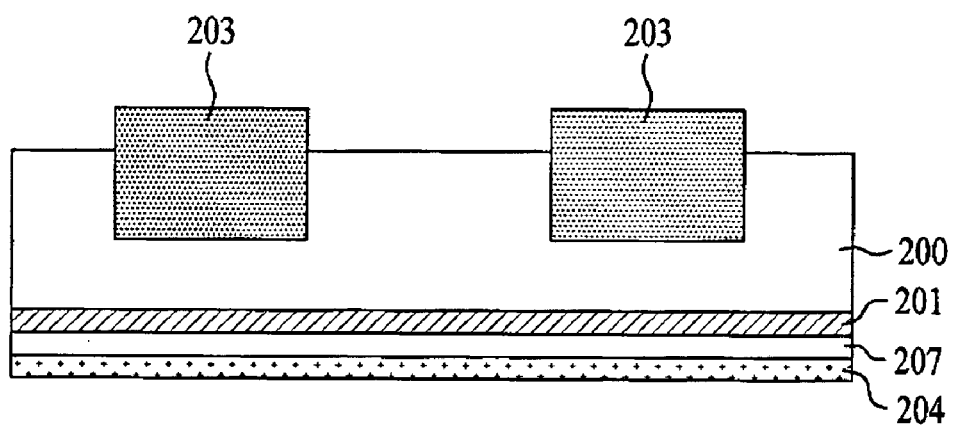

As shown in FIG. 2G, the device isolation layer 203 is exposed by removing the patterned pad nitride layer 207 and the patterned pad oxide layer 201 from the upper surface of the semiconductor substrate 200.

Figure 2H:
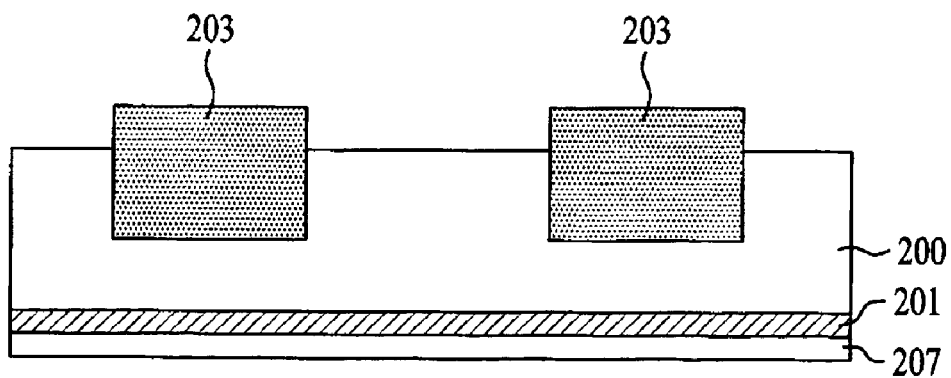

As shown in FIG. 2H, the pad nitride layer 207 is exposed by removing the passivation layer 204 formed on the lower surface of the semiconductor substrate 200.

The pad nitride layer 207 formed on the lower surface of the semiconductor substrate 200 prevents the lower surface of the semiconductor substrate 200 from being contaminated by copper when performing the copper line formation process. In other words, it is possible to prevent the copper of the pad nitride layer 207 from permeating into the lower surface of the semiconductor substrate 200.

FIGS. 3A-3G illustrate a semiconductor device fabricated in accordance with an second exemplary embodiment of the present invention.

Figure 3A:
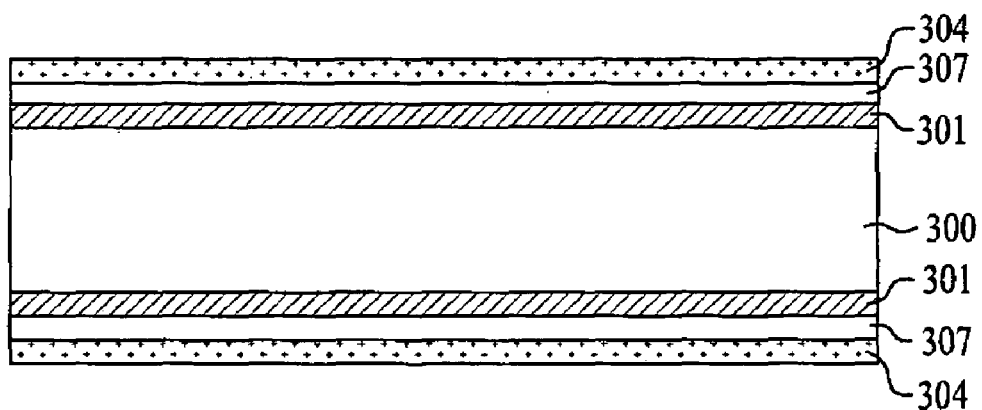
FIGS. 3A-3G are cross-sectional views of a semiconductor device fabricated in accordance with an second exemplary embodiment of the present invention.

As shown in FIG. 3A, a semiconductor substrate 300 having an active area and a non-active area is prepared. A pad oxide layer 301, a pad nitride layer 307 and a passivation layer 304 are then sequentially deposited on the entire upper surface of the semiconductor substrate 300. At the same time, a pad oxide layer 301, a pad nitride layer 307 and a passivation layer 304 are sequentially deposited on an entire lower surface of the semiconductor substrate 300. The pad nitride layer 307 can be formed of silicon nitride. The passivation layer 304 prevents the pad nitride layer 307 formed on the lower surface of the semiconductor substrate 300 from being etched, wherein the passivation layer 304 can be formed of tetra-ethyl-ortho-silicate. The remaining portions of the semiconductor device are to be formed on the upper surface of the semiconductor substrate 300.

Figure 3B:
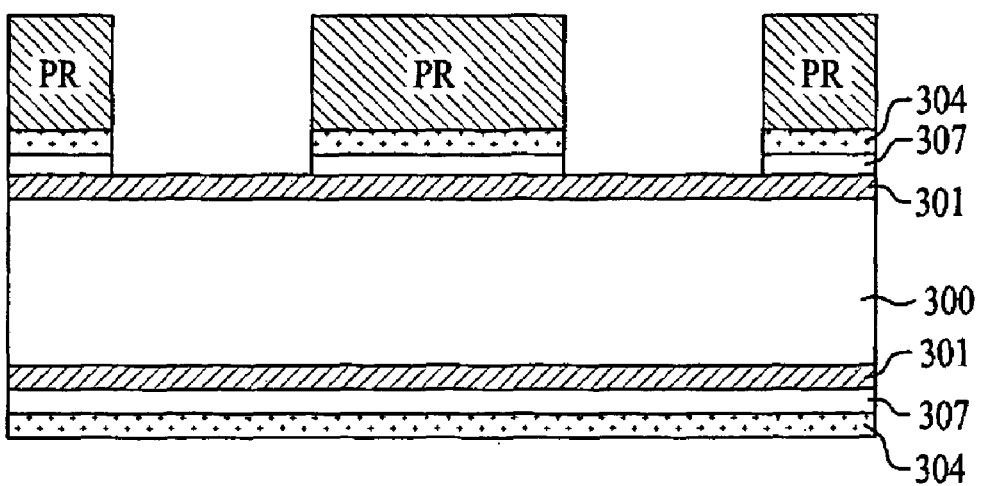

As shown in FIG. 3B, a photoresist is coated on the entire upper surface of the semiconductor substrate 300, and the coated photoresist is patterned by photolithography. Thus, a photoresist pattern PR is formed on the pad nitride layer 307 provided on the upper surface of the semiconductor substrate 300. At this time, the photoresist is patterned to cover the active area of the semiconductor substrate 300.

Figure 3C:
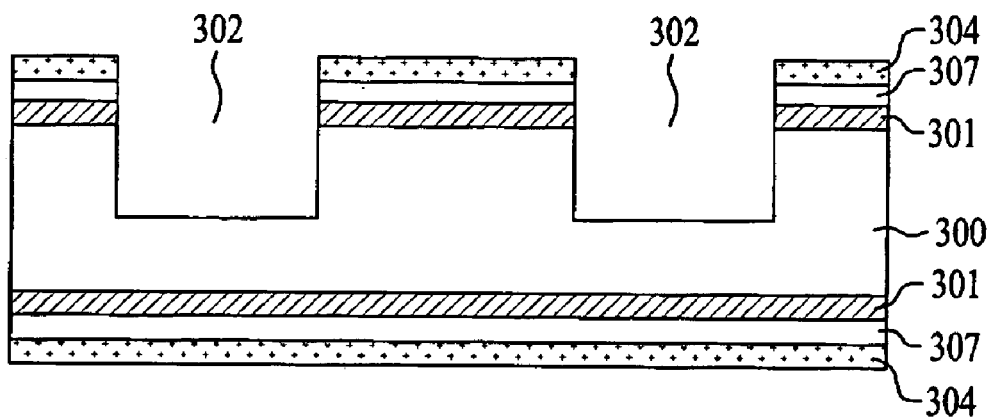

As shown in FIG. 3C, the predetermined portion of the pad oxide layer 301 exposed with the patterned photoresist PR used as a mask is etched and removed.

Figure 3D:
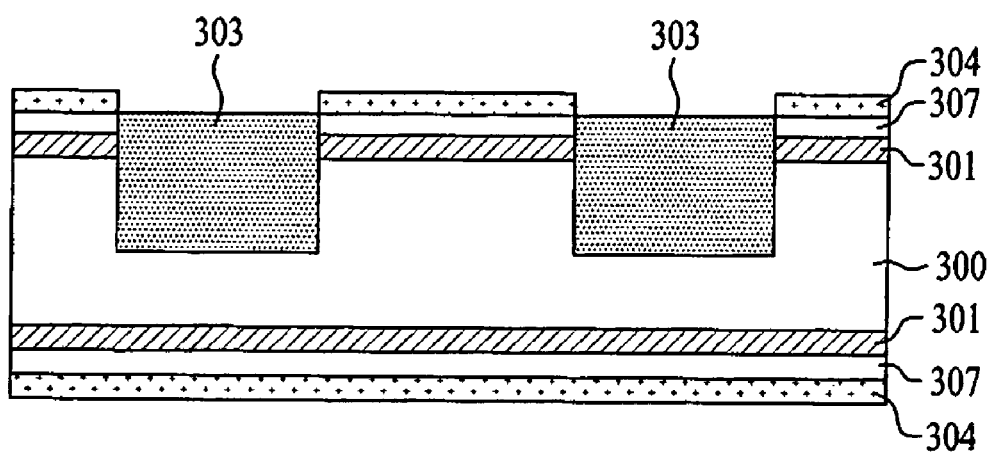

As shown in FIG. 3D, after removing the photoresist pattern PR, the exposed pad oxide layer 301 and the upper surface of the semiconductor substrate 300 are removed with the patterned pad nitride layer 307 used as a mask. As a result, a trench 302 is formed in the non-active area of the semiconductor substrate 300.

Although not shown, when performing an etching process with the photoresist pattern PR used as a mask, the photoresist pattern PR may remain, and the pad oxide layer 301, the pad nitride layer 307 and the upper surface of the semiconductor substrate 300 may be etched in sequence to form the trench 302 in the non-active area of the semiconductor substrate 300.

Figure 3E:
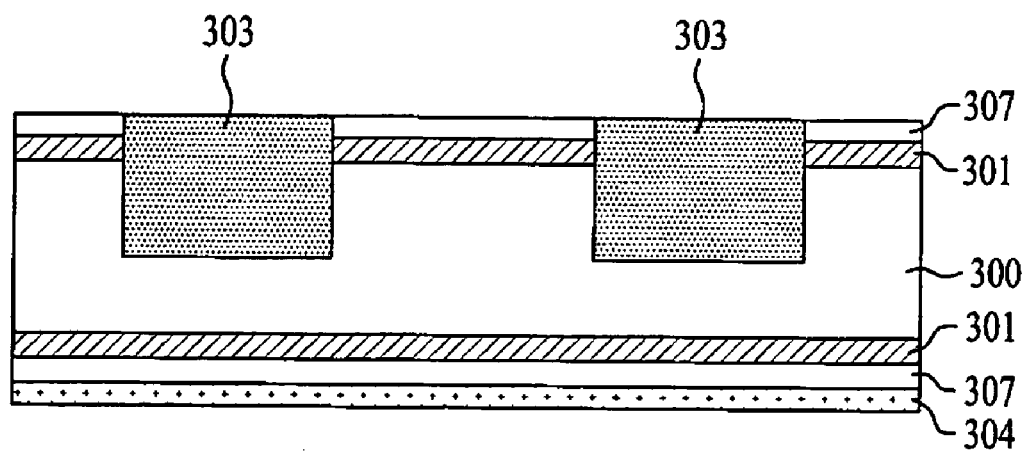

As shown in FIG. 3E, after removing the passivation layer 304 formed on the upper surface of the semiconductor substrate, an insulating layer is deposited on the entire upper surface of the semiconductor substrate 300, and is then planarized until the pad nitride layer 307 is exposed by chemical-mechanical polishing. Thus, the insulating layer is selectively formed inside the trench 302, wherein the insulating layer of the trench 302 serves as a device isolation layer 303.

Figure 3F:
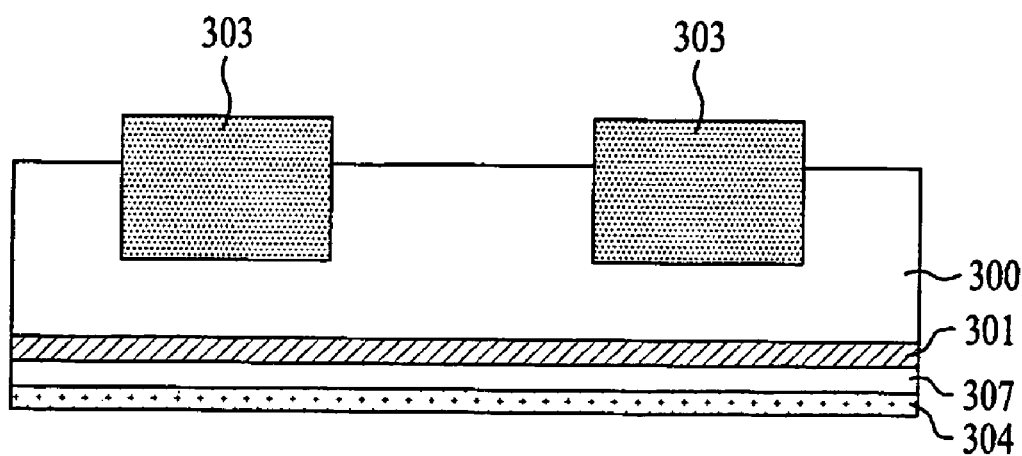

As shown in FIG. 3F, the device isolation layer 303 is exposed by removing the patterned pad nitride layer 307 and the patterned pad oxide layer 301 formed on the upper surface of the semiconductor substrate 300.

Figure 3G:
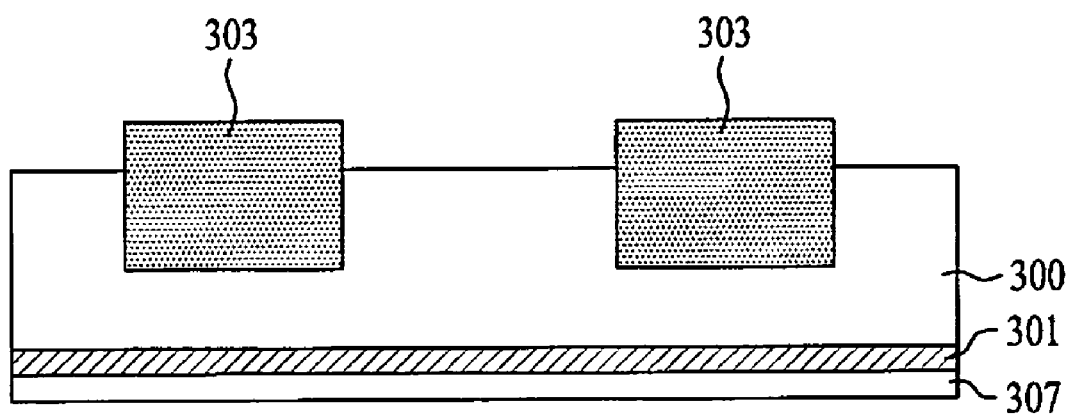

As shown in FIG. 3G, the pad nitride layer 307 is exposed by removing the passivation layer 304 formed on the lower surface of the semiconductor substrate 300.

The pad nitride layer 307 formed below the lower surface of the semiconductor substrate 300 prevents the lower substrate of the semiconductor substrate 300 from being contaminated when performing a copper line formation process. The copper of the pad nitride layer is prevented from permeating into the lower surface of the semiconductor substrate.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for fabricating a semiconductor device, comprising:
   sequentially forming a pad oxide layer and a pad nitride layer on a substrate,
   the pad oxide layer including:
      a first oxide layer formed on an upper surface of the substrate and a second oxide layer formed on a lower surface of the substrate, and
   the pad nitride layer including:
      a first nitride layer formed on the upper surface of the substrate and a second nitride layer formed on the lower surface of the substrate;
   patterning the first nitride layer by removing a portion of the first nitride layer;
   forming a trench in the substrate corresponding to the removed portion of the first nitride layer, thereby patterning the first oxide layer;
   filling the trench with an insulating material to form a device isolation layer;
   forming a passivation layer on the substrate, the passivation layer including:
      a first passivation layer formed on the upper surface of the substrate, including the device isolation layer, and
      a second passivation layer formed on the lower surface of the substrate, including the second oxide layer and the second nitride layer; and
   removing the first passivation layer, the patterned first oxide layer, and patterned first nitride layer.

2. The method of claim 1, wherein the passivation layer is formed of tetra-ethyl-ortho-silicate.

3. The method of claim 1, wherein the pad nitride layer is formed of silicon nitride.

4. The method of claim 1, wherein the semiconductor device is formed on the upper surface of the substrate.

5. The method of claim 1, further comprising:
   exposing the second nitride layer by removing the second passivation layer.

6. The method of claim 1, wherein the device isolation layer is formed by thickly depositing an insulating layer to fill the trench and then planarizing the insulating layer by chemical-mechanical polishing until the first oxide layer is exposed.

7. The method of claim 1, wherein the substrate is a semiconductor substrate of silicon.

8. The method of claim 1, said first nitride layer patterning comprising:
   forming a photoresist pattern on the first nitride layer to expose a trench region of the first oxide layer and the substrate; and
   etching the exposed trench region using the photoresist pattern as an etching mask.

9. The method of claim 8, wherein the trench is formed using the patterned nitride layer used as a mask by removing the exposed portion of the first oxide layer and a corresponding portion of the substrate.

10. The method of claim 8, wherein the substrate includes regions defined as active and inactive regions, and wherein the photoresist pattern covers the active regions and exposes the inactive regions.

11. A method for fabricating a semiconductor device, comprising:
    sequentially forming a pad oxide layer, a pad nitride layer and a passivation layer on each of entire lower and upper surfaces of a semiconductor substrate;
    forming a photoresist pattern on the passivation layer provided on the upper surface of the semiconductor substrate, and removing the pad nitride layer and the passivation layer exposed with the photoresist pattern used as a mask;
    removing the photoresist pattern, and forming a trench by removing the pad oxide layer and the upper surface of the semiconductor substrate exposed with the patterned nitride layer and the patterned passivation layer used as a mask;
    forming a device isolation layer by forming an insulating layer inside the trench;
    removing the patterned pad oxide layer and the patterned pad nitride layer from the upper surface of the semiconductor substrate; and
    exposing the pad nitride layer by removing the passivation layer provided on the lower surface of the semiconductor substrate.

12. A method for fabricating a semiconductor substrate, comprising:
    sequentially forming a pad oxide layer and a pad nitride layer on each of lower and upper surfaces of a semiconductor substrate;
    forming a photoresist pattern on the pad oxide layer provided on the upper surface of the semiconductor substrate, and forming a trench by sequentially removing the pad nitride layer, the pad oxide layer and the upper surface of the semiconductor substrate exposed with the photoresist pattern used as a mask;
    removing the photoresist pattern, and forming a device isolation layer by forming an insulating layer inside the trench;
    forming a passivation layer on the upper surface of the semiconductor substrate, including the device isolation layer, and on the entire lower surface of the semiconductor substrate including the pad oxide layer and the pad nitride layer;
    removing the passivation layer provided on the upper surface of the semiconductor substrate;
    removing the patterned pad oxide layer and the pad nitride layer from the upper surface of the semiconductor substrate; and
    exposing the pad nitride layer by removing the passivation layer provided on the lower surface of the semiconductor substrate.

13. A method for fabricating a semiconductor device, comprising:
    sequentially forming a pad oxide layer, a pad nitride layer and a passivation layer on each of entire lower and upper surfaces of a semiconductor substrate;
    forming a photoresist pattern on the passivation layer provided on the upper surface of the semiconductor substrate, and forming a trench by sequentially removing the passivation layer, the pad nitride layer and the pad oxide layer exposed with the photoresist pattern used as a mask;

removing the photoresist pattern and the patterned passivation layer from the upper surface of the semiconductor substrate;

forming a device isolation layer by forming an insulating layer inside the trench;

removing the patterned pad oxide layer and the patterned pad nitride layer from the upper surface of the semiconductor substrate; and exposing the pad nitride layer by removing the passivation layer provided on the lower surface of the semiconductor substrate.

* * * * *